(12) United States Patent
Gershon et al.

(10) Patent No.: US 10,079,321 B2
(45) Date of Patent: Sep. 18, 2018

(54) TECHNIQUE FOR ACHIEVING LARGE-GRAIN $AG_2ZNSN(S,SE)_4$ THIN FILMS

(71) Applicant: International Business Machines Corporation, Armonk, NY (US)

(72) Inventors: Talia S. Gershon, White Plains, NY (US); Michael S. Gordon, Yorktown Heights, NY (US); Yun Seog Lee, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/198,795

(22) Filed: Jun. 30, 2016

(65) Prior Publication Data

US 2018/0006173 A1 Jan. 4, 2018

(51) Int. Cl.
*H01L 31/032* (2006.01)
*H01L 31/02* (2006.01)
(Continued)

(52) U.S. Cl.
CPC ........ *H01L 31/0326* (2013.01); *C01B 19/007* (2013.01); *C01G 19/006* (2013.01);
(Continued)

(58) Field of Classification Search
CPC ............. H01L 31/0326; H01L 31/0327; H01L 31/0322; H01L 31/0323
See application file for complete search history.

(56) References Cited

U.S. PATENT DOCUMENTS 8,642,884 B2 2/2014 Mitzi et al.
8,679,893 B2 3/2014 Liang et al.
(Continued)

FOREIGN PATENT DOCUMENTS

CN 101443929 A 5/2009
JP 5278418 B2 9/2013
(Continued)

OTHER PUBLICATIONS

A. Redinger and S. Siebentritt, "Coevaporation of Cu2ZnSnSe4 thin films", Applied Physics Letters 97, 092111 (2010).*
(Continued)

*Primary Examiner* — Eric R Smith
(74) *Attorney, Agent, or Firm* — Vazken Alexanian; Michael J. Chang, LLC

(57) ABSTRACT

Techniques for increasing grain size in AZTSSe absorber materials are provided. In one aspect, a method for forming an absorber film on a substrate includes: contacting the substrate with an Ag source, a Zn source, a Sn source, and an S source and/or an Se source under conditions sufficient to form the absorber film on the substrate having a target composition of: $Ag_XZn_YSn(S,Se)_Z$, wherein $1.7<x<2.2$, $0.9<y<1.3$, and $3.5<z<4.5$, and including an amount of the Ag source that is from about 10% to about 30% greater than is needed to achieve the target composition; annealing the absorber film; and removing excess Ag from the absorber film. A solar cell and method for fabrication thereof are also provided.

17 Claims, 4 Drawing Sheets

(51) Int. Cl.
  *H01L 31/0224* (2006.01)
  *H01L 31/0392* (2006.01)
  *H01L 31/18* (2006.01)
  *C01B 19/00* (2006.01)
  *C01G 19/00* (2006.01)

(52) U.S. Cl.
  CPC ............. *H01L 31/02008* (2013.01); *H01L 31/022475* (2013.01); *H01L 31/022483* (2013.01); *H01L 31/0392* (2013.01); *H01L 31/18* (2013.01); *H01L 31/1864* (2013.01); *C01P 2006/40* (2013.01)

(56) References Cited

U.S. PATENT DOCUMENTS

| | | | |
|---|---|---|---|
| 8,883,550 B2 | 11/2014 | Fujdala et al. | |
| 8,945,980 B2 | 2/2015 | Vail et al. | |
| 9,013,021 B2 | 4/2015 | Van Duren et al. | |
| 9,178,097 B2 | 11/2015 | Liang et al. | |
| 9,184,322 B2 | 11/2015 | Hopstaken et al. | |
| 9,306,111 B2 | 4/2016 | Berg et al. | |
| 2006/0219288 A1 | 10/2006 | Tuttle | |
| 2009/0320916 A1* | 12/2009 | Yuan | C23C 18/08 136/256 |
| 2012/0100663 A1 | 4/2012 | Bojarczuk et al. | |
| 2013/0164885 A1* | 6/2013 | Liang | H01L 21/02472 438/95 |
| 2013/0217177 A1* | 8/2013 | Wong | C23C 16/306 438/95 |
| 2014/0020738 A1* | 1/2014 | Aida | H01L 31/0322 136/255 |
| 2014/0182665 A1 | 7/2014 | Liang | |
| 2015/0087107 A1* | 3/2015 | Hiraga | H01L 31/20 438/95 |

FOREIGN PATENT DOCUMENTS

| | | | |
|---|---|---|---|
| JP | WO 2013160356 A1 * | 10/2013 | ....... H01L 21/02554 |
| KR | 20150051181 A | 5/2015 | |

OTHER PUBLICATIONS

English Translation of KR20150051181A by Son Dae Ho et al., May 11, 2015.
English Translation of CN101443929A by Daystar Technologies Inc., May 27, 2009.
English Translation of JP5278418B2 by Toyota Central R&D Labs, Sep. 4, 2013.
Wei et al., "The effect of Ag incorporation on the phase stability, crystallinity and band structure on the phase stability, crystallinity and band structure on the (Cu,Ag)2ZnSn(S,Se)4 kesterite solar cells," IEEE 42nd Photovoltaic Specialist Conference (PVSC) 2015, pp. 1-4 (Jun. 2015).
Yuan et al., "Optimization of CIGS-Based PV Device through Antimony Doping," Chem. Mater. 2010, 22, pp. 285-287 (published Dec. 2009).
Gershon et al., "The Role of Sodium as a Surfactant and Suppressor of Non-Radiative Recombination at Internal Surfaces in Cu2ZnSnS4," Adv. Energy Mater. Aug. 2014, 1400849 (8 pages).

* cited by examiner

TECHNIQUE FOR ACHIEVING LARGE-GRAIN AG$_2$ZNSN(S,SE)$_4$ THIN FILMS

STATEMENT OF GOVERNMENT RIGHTS

This invention was made with Government support under Contract number DE-EE0006334 awarded by Department of Energy. The Government has certain rights in this invention.

FIELD OF THE INVENTION

The present invention relates to Ag$_2$ZnSn(S,Se)$_4$ ("AZTSSe") absorber materials, and more particularly, to techniques for increasing grain size in AZTSSe absorber materials by including excess silver (Ag) during deposition.

BACKGROUND OF THE INVENTION

The new photovoltaic compound Ag$_2$ZnSn(S,Se)$_4$ ("AZTSSe") has many promising material properties. AZTSSe has a lower defect density than the compound it is based on, Cu$_2$ZnSn(S,Se)$_4$ ("CZTSSe"). See, for example, U.S. patent application Ser. No. 14/936,131 by Gershon et al., entitled "Photovoltaic Device Based on Ag$_2$ZnSn(S,Se)$_4$ Absorber" (hereinafter "U.S. patent application Ser. No. 14/936,131").

Grain size affects energy conversion efficiency of absorber materials, with a larger grain size generally resulting in a greater efficiency. Therefore, techniques for controlling the grain size in AZTSSe absorber materials would be desirable.

SUMMARY OF THE INVENTION

The present invention provides techniques for increasing grain size in AZTSSe absorber materials. In one aspect of the invention, a method for forming an absorber film on a substrate is provided. The method includes: contacting the substrate with an Ag source, a Zn source, a Sn source, and at least one of an S source and an Se source under conditions sufficient to form the absorber film on the substrate having a target composition of: Ag$_X$Zn$_Y$Sn(S,Se)$_Z$, wherein $1.7<x<2.2$, $0.9<y<1.3$, and $3.5<z<4.5$, and including an amount of the Ag source that is from about 10% to about 30% greater than is needed to achieve the target composition; annealing the absorber film; and removing excess Ag, if any, from the absorber film. Optionally, the composition of the absorber could be measured using Particle Induced X-ray Emission (PIXE) techniques.

In another aspect of the invention, an absorber film is provided that is formed on a substrate by the above method. The absorber film has a composition of: Ag$_X$Zn$_Y$Sn(S,Se)$_Z$, wherein $1.7<x<2.2$, $0.9<y<1.3$, and $3.5<z<4.5$, and wherein the absorber film has an average grain size of from about 0.5 micrometers to about 4 micrometers, and ranges therebetween.

In yet another aspect of the invention, a method of forming a solar cell is provided. The method includes: contacting a conducting substrate with an Ag source, a Zn source, a Sn source, and at least one of an S source and an Se source under conditions sufficient to form the absorber film on the conducting substrate having a target composition of: Ag$_X$Zn$_Y$Sn(S,Se)$_Z$, wherein $1.7<x<2.2$, $0.9<y<1.3$, and $3.5<z<4.5$, and including an amount of the Ag source that is from about 10% to about 30% greater than is needed to achieve the target composition; annealing the absorber film; removing excess Ag, if any, from the absorber film; forming a buffer layer on the absorber layer; and forming a transparent front contact on the buffer layer. Optionally, the composition of the absorber could be measured using Particle Induced X-ray Emission (PIXE) techniques.

In still yet another aspect of the invention, a solar cell is provided. The solar cell includes: a substrate; a conductive layer on the substrate; an absorber layer on the conductive layer, the absorber layer having a composition of: Ag$_X$Zn$_Y$Sn(S,Se)$_Z$, wherein $1.7<x<2.2$, $0.9<y<1.3$, and $3.5<z<4.5$, and wherein the absorber layer has an average grain size of from about 0.5 micrometers to about 4 micrometers, and ranges therebetween; a buffer layer on the absorber layer; and a transparent front contact on the buffer layer.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for increasing the grain size (i.e., coarsening) of Ag$_2$ZnSn(S,Se)$_4$ ("AZTSSe") absorber materials. The term "AZTSSe," as used herein, refers to a material containing silver (Ag), zinc (Zn), tin (Sn), and at least one of sulfur (S) and selenium (Se). AZTSSe materials are described generally in U.S. patent application Ser. No. 14/936,131, the contents of which are incorporated by reference as if fully set forth herein.

As described in U.S. patent application Ser. No. 14/936,131, AZTSSe absorbers are based on CIGSSe and CZTSSe materials, wherein the Cu or Zn, respectively, is swapped out for a different cation (in this case Ag). The term "CIGSSe," as used herein, refers to a material containing copper (Cu), indium (In), gallium (Ga), and at least one of S and Se. The term "CZTSSe," as used herein, refers to a material containing Cu, Zn, Sn, and at least one of S and Se. The use of AZTSSe absorbers avoids the Cu—Zn antisite formation and resulting band tailing problems associated with conventional materials like CZTSSe. See U.S. patent application Ser. No. 14/936,131.

Advantageously, it has been found herein that the grain size of AZTSSe absorber materials can be controlled by controlling the Ag content of the material. Namely, to enhance the performance of the resulting devices, an excess amount of Ag (i.e., an amount of Ag in excess of what is needed to produce the desired final composition) can be used during formation of the material to increase (i.e., coarsen) the grain size of the AZTSSe material.

As will be described in detail below, according to an exemplary embodiment, the final AZTSSe material has a formula:

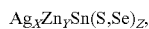

$Ag_X Zn_Y Sn(S,Se)_Z$, wherein $1.7 < x < 2.2$, $0.9 < y < 1.3$, and $3.5 < z < 4.5$, and an excess amount of Ag (in excess of what is needed to achieve this formula) of from about 10% to about 30%, and ranges therebetween, is added during deposition of the material. Thus, to use a simple example to illustrate this concept, if the final desired composition is $Ag_2 ZnSn(S,Se)_4$, then $Ag_{2.2}$ would be added to get 10% extra Ag during deposition of the material. Proton-Induced X-ray Emission (PIXE) is an analytical technique that can be used to measure the stoichiometry of the elements making up the absorber, and is sensitive enough to measure the excess Ag from the nominal level.

Without being bound by any particular theory, it is thought that the excess Ag acts as flux (i.e., flow) agent during the AZTSSe formation process. Namely, grain size is controlled by the movement of atoms into a grain from adjacent grains. Grain boundaries act as barriers to this atom diffusion. By adding a flux agent, the atoms can flux through to the other grains. Specifically, during annealing (see below), liquid (or high-diffusivity) $Ag_2Se$ or $Ag_8SnSe_6$ (secondary phases formed as a result of the excess Ag) increases kinetics of atomic transport across grain boundaries.

Figure 1:
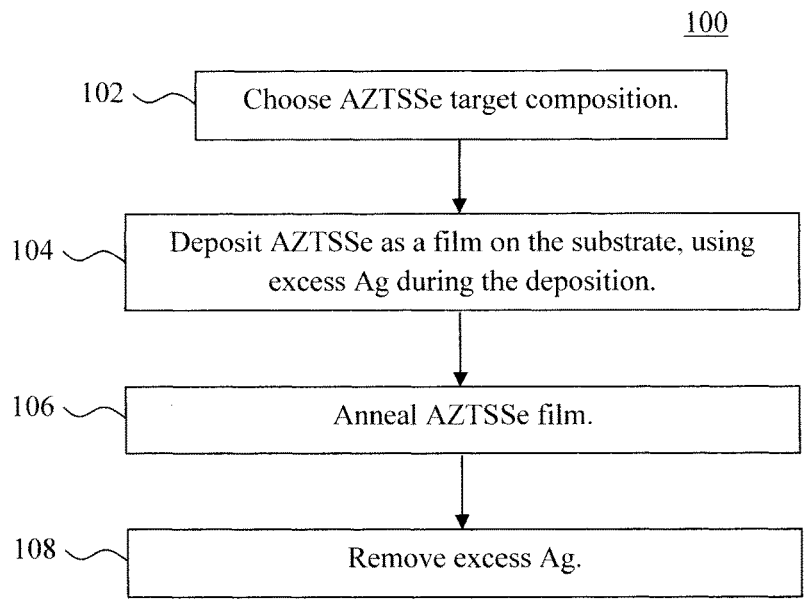
FIG. 1 is a diagram illustrating an exemplary methodology for forming an AZTSSe film on a substrate according to an embodiment of the present invention.
Figure 2:
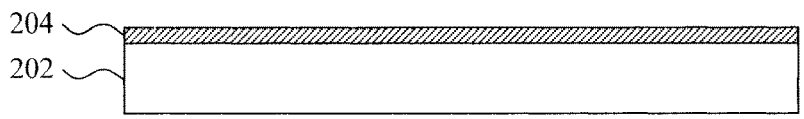
FIG. 2 is a cross-sectional diagram illustrating an exemplary starting structure for fabricating an AZTSSe-based solar cell including a substrate and a conductive layer on the substrate according to an embodiment of the present invention.

An exemplary process for forming an AZTSSe film on a substrate is now described by way of reference to methodology 100 of FIG. 1. In order to configure the deposition process, a target composition of the AZTSSe material is chosen in step 102. This will enable one to know how much extra Ag to add (as a flux agent) during the deposition. According to an exemplary embodiment, the target composition is $Ag_X Zn_Y Sn(S,Se)_Z$, wherein $1.7 < x < 2.2$, $0.9 < y < 1.3$, and $3.5 < z < 4.5$.

In step 104, AZTSSe is deposited onto the substrate, wherein an amount of Ag used during the deposition is from about 10% to about 30%, and ranges therebetween, greater than what is needed for the target composition. For instance, as per the example provided above, if the target composition is $Ag_2 ZnSn(S,Se)_4$, then increasing the Ag flux during the deposition so as to achieve a composition of $Ag_{2.2} ZnSn(S,Se)_4$ in the final film would constitute an excess amount of Ag of 10%.

According to an exemplary embodiment, the AZTSSe is deposited onto the substrate using a thermal evaporation process. By way of example only, the substrate is heated within a vacuum chamber, and held at a temperature of from about 100 degrees Celsius (° C.) to about 400° C., and ranges therebetween. Thermal evaporation is then used to co-evaporate Ag, Zn, and Sn, and S and/or Se from their respective sources onto the substrate. In general, a thermal evaporation process involves heating and evaporation of a target source material (in this case Ag, Zn, Sn, S and/or Se evaporation source materials) with a heating element (e.g., as in a Knudsen cell or a thermal cracking cell) to transform constituent atoms into the gaseous phase (forming a source gas). When the source gases meet the substrate, these atoms can react and precipitate into a film which deposits on the substrate, forming a layer of the compound AZTSSe material on the substrate.

The temperature at which the source materials are heated can be controlled to regulate the amount of the corresponding material in the source gas. Namely, the present techniques involve using an excess amount of Ag during deposition. That excess amount of Ag can be generated by controlling the temperature of the Ag source to achieve a higher Ag flux. See also FIGS. 6A-C, described below.

According to an exemplary embodiment, a thermal cracking source is used for the S and the Se, wherein the S and the Se sources have two zones. One zone heats the bulk source material to make it evaporate, and another zone cracks the material, e.g., from $S8$ to elemental S (i.e., from a long-chain molecule comprising up to 8 chalcogen atoms to smaller molecules, or in the limit one atom of S or Se). The flux of the S and/or Se can be controlled both by regulating the bulk zone temperature as well as by controllably opening of a needle valve between the two zones. This thermal cracking for the S and Se sources can be carried out using a commercially available thermal cracking cell. This process can be used to control the ratio of S to Se in the material (i.e., the ratios of S/(S+Se) or Se/(S+Se)). By regulating the ratio of S to Se in the material, one can control the band gap of the AZTSSe material. By way of example only, a suitable apparatus that may be employed in accordance with the present techniques to supply controlled amounts of S and/or Se during kesterite absorber film growth is described, for example, in U.S. Patent Application Publication Number 20120100663 by Bojarczuk et al., entitled "Fabrication of CuZnSn(S,Se) Thin Film Solar Cell with Valve Controlled S and Se" (hereinafter "U.S. Patent Application Publication Number 2012/0100663"), the contents of which are incorporated by reference as if fully set forth herein. U.S. Patent Application Publication Number 2012/0100663 describes an apparatus that includes two separate cracking cells, one for S and another for Se. Each cracking cell can be independently regulated to control the amounts of S and Se present during deposition. Thus, according to an exemplary embodiment, the S and Se source gas in the vapor chamber is introduced via one or more independently controllable cracking cells.

Accordingly, (gaseous) sources of Ag, Zn, Sn (e.g., by coevaporation), and at least one of S and Se (e.g., by cracking) can be created in the vacuum chamber. When contacted with the heated substrate, atoms from these sources can react and precipitate on the substrate forming an AZTSSe film. Suitable conditions for this AZTSSe deposition process include, but are not limited to, a temperature of from about 10° C. to about 450° C., and ranges therebetween, a duration of from about 1 minute to about 200 minutes, and ranges therebetween, and a vacuum chamber pressure of from about $1\times10^{-5}$ Torr to about $5\times10^{-10}$ Torr, and ranges therebetween.

Following deposition, the AZTSSe film is annealed in step 106. Annealing improves the crystal grain structure as well as the defect structure, and in some cases may be necessary to form a material having a kesterite structure. According to an exemplary embodiment, conditions for the anneal performed in step 106 include a temperature of from about 430° C. to about 550° C., and ranges therebetween, for a duration of from about 20 seconds to about 10 minutes, and ranges therebetween.

Optionally, the anneal can be carried out in an environment containing excess chalcogen, e.g., excess S and/or Se. See, for example, U.S. Pat. No. 8,642,884 issued to Mitzi et al., entitled "Heat Treatment Process and Photovoltaic Device Based on Said Process" (hereinafter "U.S. Pat. No. 8,642,884"), the contents of which are incorporated by reference as if fully set forth herein. U.S. Pat. No. 8,642,884 describes use of a sulfurization or selenization heat treatment process to passivate the layers and interfaces in the device.

As provided above, it is proposed that the excess Ag acts as a flux agent during the deposition process, enabling a greater atomic mobility across the grain boundaries and thereby enhancing grain size. For instance, according to an exemplary embodiment, following the anneal the resulting AZTSSe film has an average grain size of from about 0.5 micrometers (µm) to about 4 µm, and ranges therebetween depending on the excess Ag provided during the annealing stage. By way of example only, grain size can be measured as the average cross-sectional dimension of the grain.

Excess Ag used during deposition can result in the formation of secondary phases (i.e., portions of the deposited material that are not AZTSSe). One can observe whether or not these phases are present using X-ray diffraction (see FIG. 8, described below). When present, these secondary phases can be removed selectively from the grain boundaries. By way of example only, secondary phases can include $Ag_2Se$ and $Ag_6SnSe_8$. The goal is to produce a single-phase AZTSSe material. Therefore, in step 108 the excess Ag (i.e., these secondary phases) are removed, leaving behind single-phase AZTSSe in the film.

According to an exemplary embodiment, an etch is used remove the excess Ag. For instance, potassium cyanide (KCN) or sodium cyanide (NaCN) can be used as etchants to remove $Ag_6SnSe_8$ and $Ag_2Se$. Thus, according to an exemplary embodiment, the etch is performed in KCN and/or NaCN.

As a result of the above-described process, a film of large-grained single-phase AZTSSe is produced on the substrate. The AZTSSe film can have a variety of different applications. By way of example only, the AZTSSe film can be used as the absorber material in a photovoltaic device. Accordingly, an exemplary embodiment employing the present techniques to form an AZTSSe absorber-based solar cell is now described by way of reference to FIGS. 2-5.

As with the embodiment described above, the process begins with a suitable substrate 202 on which the AZTSSe absorber will be formed. For solar cell applications, if not conductive itself, the substrate 202 is coated with a conductive layer 204 which will serve as an electrode of the solar cell. In one exemplary configuration, the solar cell is constructed as a series of layers as a stack on the substrate 202, and another electrode will be formed on top of the stack. In that case, the conductive layer 204 might also be referred to herein as a bottom contact/electrode, and the other the top/front contact/electrode.

According to an exemplary embodiment, the substrate 202 is glass, ceramic, metal foil, or plastic substrate. Suitable materials for the conductive layer 204 include, but are not limited to, metal-containing materials (such as molybdenum (Mo) and/or transparent conducting oxides (TCOs) such as fluorinated tin oxide ($SnO_2$:F, FTO), tin-doped indium oxide ($In_2O_3$:Sn, ITO), and doped ZnO such as aluminum-doped ZnO (ZnO:Al, AZO). The conductive layer 204 can be formed on the substrate 202 using a process such as evaporation, sputtering, atomic layer deposition (ALD), or spray pyrolysis. By way of example only, the conductive layer 204 is formed having a thickness of from about 0.1 µm to about 4 µm, and ranges therebetween.

Figure 3:
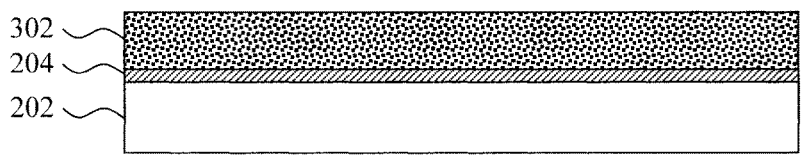
FIG. 3 is a cross-sectional diagram illustrating an AZTSSe absorber having been formed on the substrate according to an embodiment of the present invention.
Figure 4:
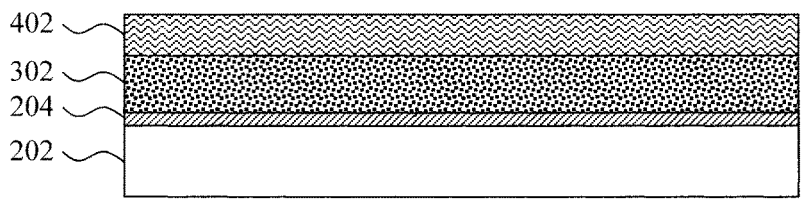
FIG. 4 is a cross-sectional diagram illustrating a buffer layer having been formed on the AZTSSe absorber according to an embodiment of the present invention.

Next, as shown in FIG. 3, an AZTSSe absorber 302 is formed on the substrate 202 (or on the conductive layer 204-coated substrate 202). According to an exemplary embodiment, the AZTSSe absorber 302 is formed according to methodology 100 of FIG. 1, described above. Namely, based on a selected target composition of the AZTSSe absorber 302, an excess amount of Ag (e.g., from about 10% to about 30%, and ranges therebetween) is used during the deposition which, as described above, serves to enhance the grain size of the AZTSSe. After deposition, the AZTSSe is annealed, and excess Ag (e.g., secondary phases such as $Ag_2Se$ and $Ag_6SnSe_8$) is then removed. The result is a single-phase AZTSSe absorber 302 having been formed on the substrate 202 (or on the conductive layer 204-coated substrate 202).

As described in detail above, the excess Ag during deposition of the AZTSSe acts as a flux agent that increases kinetics of atomic transport across grain boundaries via the high-diffusivity secondary phases (e.g., $Ag_2Se$ or $Ag_8SnSe_6$) that are formed during annealing. Thus, a coarse grain can be achieved. For instance, according to an exemplary embodiment, the AZTSSe absorber 302 has an average grain size of from about 0.5 µm to about 4 µm, and ranges therebetween.

A buffer layer 402 is then formed on the AZTSSe absorber 302. See FIG. 4. It is notable that the features in the figures may not be drawn to scale, e.g., in practice the absorber is much thicker than the buffer. As described in U.S. patent application Ser. No. 14/936,131, AZTSSe is inherently an n-type material. Thus, traditional buffer materials, such as cadmium sulfide (CdS) which is also an n-type material, might not suffice. On the other hand, p-type buffer layers would be suitable for an AZTSSe-based solar cell. By way of example only, viable buffer materials for an AZTSSe-based solar cell include, but are not limited to, copper(I) oxide ($Cu_2O$), nickel(II) oxide (NiO), zinc telluride (ZnTe), aluminum phosphide (AlP), molybdenum trioxide ($MoO_3$), cadmium telluride (CdTe), copper(I) iodide (CuI), molybdenum(IV) oxide ($MoO_2$), molybdenum disulfide ($MoS_2$), molybdenum diselenide ($MoSe_2$), and combinations thereof, where the roman numerals in the parentheses indicate the valence state of the metal atoms in the compound. Alternatively, as described in U.S. patent application Ser. No. 14/936,131 (see, e.g., FIG. 7), doping can be employed to modify the carrier concentration and make the AZTSSe absorber compatible with conventional device materials like CdS. For instance, incorporating indium (In) into the AZTSSe absorber will make the absorber less n-type.

Figure 5:
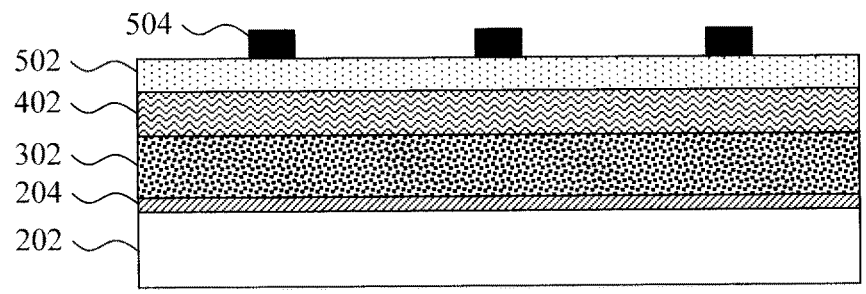
FIG. 5 is a cross-sectional diagram illustrating a transparent front contact having been formed on the buffer layer and metal contacts having been formed on the transparent front contact according to an embodiment of the present invention.

A transparent front contact 502 is next formed on the buffer layer 502. Suitable materials for forming the transparent front contact 502 include, but are not limited to, a transparent conductive oxide (TCO) such as indium-tinoxide (ITO) and/or aluminum (Al)-doped zinc oxide (ZnO) (AZO), which can be deposited onto the buffer layer 502 using a process such as sputtering. As shown in FIG. 5, metal contacts 504 may also be formed on the transparent front contact 502. Suitable materials for forming the metal contacts 504 include, but are not limited to, aluminum (Al) and/or nickel (Ni), which can be deposited onto the transparent front contact 504 using a process such as thermal or electron-beam (e-beam) evaporation.

Figure 6A:
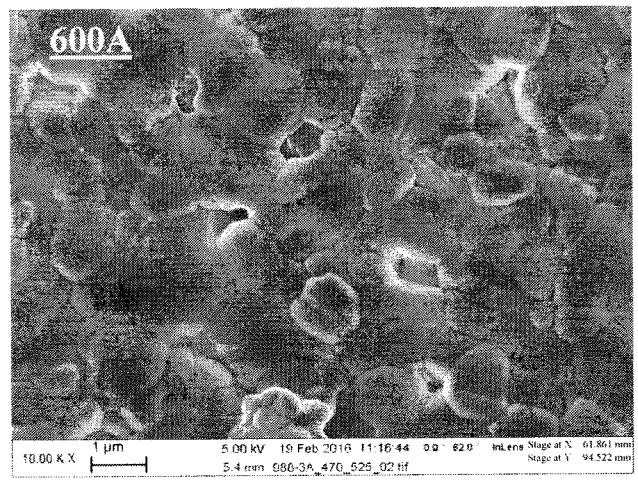
FIG. 6A is an image of an AZTSSe absorber formed using the present techniques with a baseline Ag flux, according to an embodiment of the present invention.
Figure 6B:
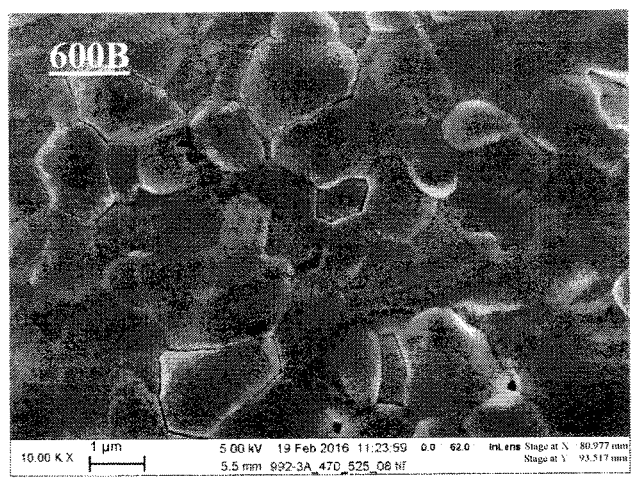
FIG. 6B is an image of an AZTSSe absorber formed using the present techniques withabout 20% excess Ag flux, according to an embodiment of the present invention.
Figure 6C:
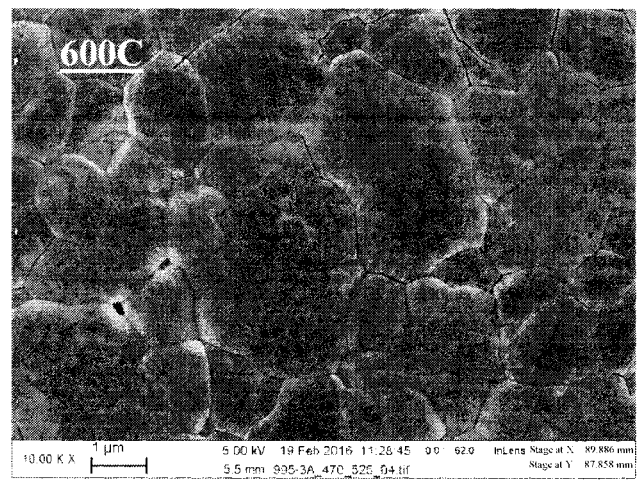
FIG. 6C is an image of an AZTSSe absorber formed using the present techniques with about 40% excess Ag flux according to an embodiment of the present invention.

As provided above, the amount of the components in the AZTSSe absorber can be controlled by the temperature of the respective source. In particular, in order to generate the excess amount of Ag during deposition, one can simply control the temperature at which the Ag source is heated to control how much Ag is present in the source gas during evaporation. FIGS. 6A-C depict images of AZTSSe absorber samples prepared at three different Ag source temperatures, corresponding to baseline (FIG. 6A), 20% (FIG. 6B) and 40% excess Ag flux (FIG. 6C).

Specifically, FIG. 6A is an image 600A of an AZTSSe absorber formed using the present techniques with an Ag source temperature of 907 degrees Celsius (° C.), corresponding to a baseline Ag flux. This sample in image 600A had a grain size (average±Std. Dev.) of 1.15±1.05 μm. FIG. 6B is an image 600B of an AZTSSe absorber formed using the present techniques with an Ag source temperature of 917° C. By increasing the temperature by 10 degrees (i.e., as compared to the sample shown in image 600A), about 20% more Ag was generated in the source gas. This sample in image 600B had an (increased) grain size (average±Std. Dev.) of 1.47±1.28 μm. FIG. 6C is an image 600C of an AZTSSe absorber formed using the present techniques with an Ag source temperature of 922° C. By increasing the temperature by 15 degrees (i.e., as compared to the sample shown in image 600A), about 40% more Ag was generated in the source gas. This sample in image 600C had an (increased) grain size (average±Std. Dev.) of 2.15±2.00 μm.

Figure 7:
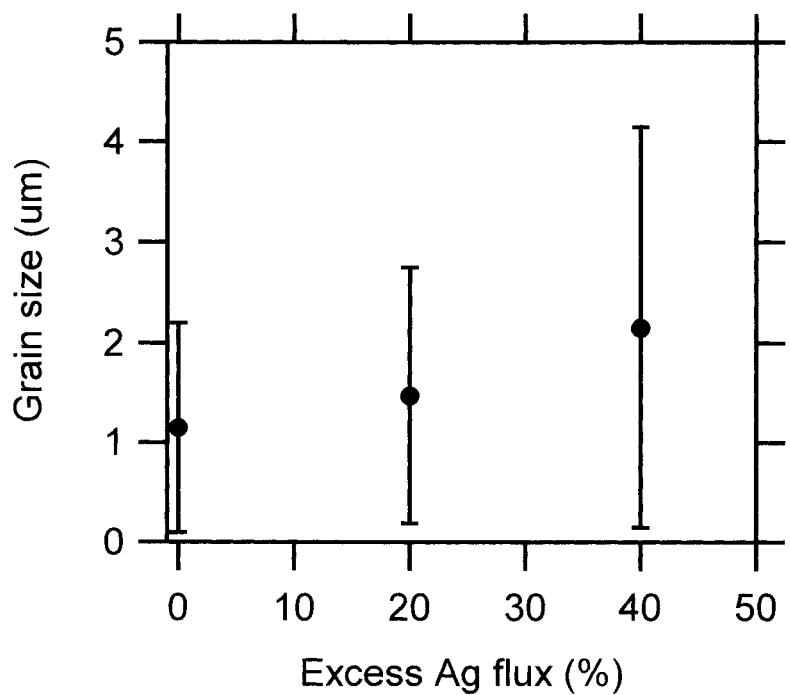
FIG. 7 is a diagram illustrating grain size as a function of Ag source temperature based on the samples shown in FIGS. 6A-C according to an embodiment of the present invention.

The results shown in FIGS. 6A-C are represented graphically in FIG. 7. In FIG. 7, the Ag source temperature (measured in ° C.) is plotted on the x-axis, and the grain size (measured in μm) is plotted on the y-axis. As shown in FIG. 7, the increase in Ag source temperature correlates with an increase in grain size due, as described above, to the excess Ag present during deposition.

Figure 8:
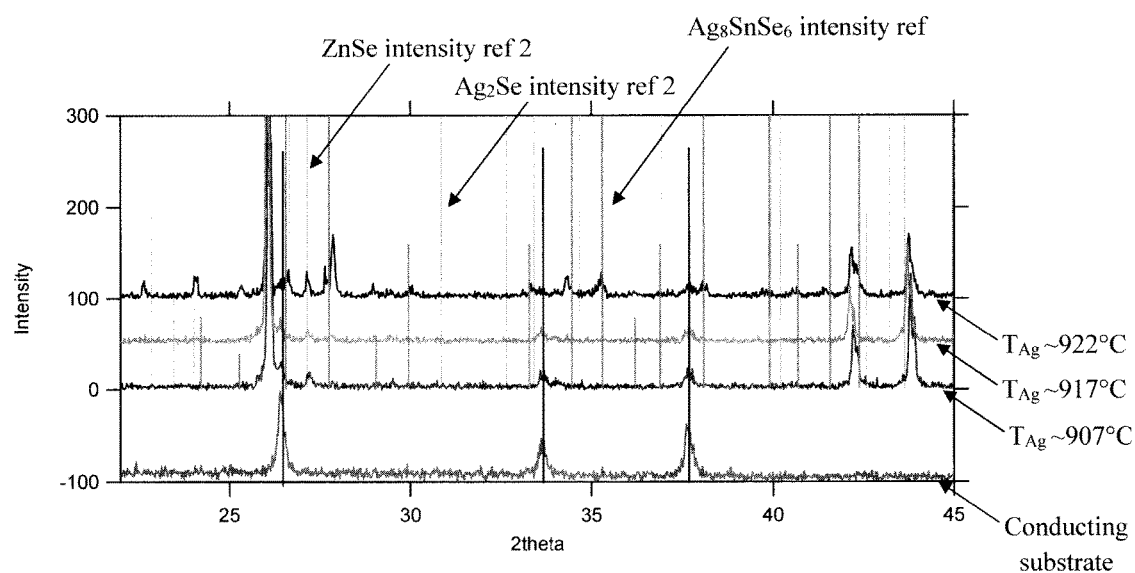
FIG. 8 is an X-ray diffraction of a sample AZTSSe film according to an embodiment of the present invention.

FIG. 8 is an X-ray diffraction plot of a sample AZTSSe. As provided above, X-ray diffraction can be used to observe whether or not Ag secondary phases are present in the sample. When present, the secondary phases can be removed from the grain boundaries.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming an absorber film on a substrate, comprising:
   contacting the substrate with an Ag source, a Zn source, a Sn source, and at least one of an S source and an Se source under conditions sufficient to form the absorber film on the substrate having a target composition of: $Ag_X Zn_Y Sn(S,Se)_Z$, wherein $1.7<x<2.2$, $0.9<y<1.3$, and $3.5<z<4.5$, and including an amount of the Ag source that is from about 10% to about 30% greater than is needed to achieve the target composition;
   annealing the absorber film; and
   removing excess Ag, if any, from the absorber film, wherein the excess Ag forms a secondary phase, and wherein the removing is performed after the annealing to remove the secondary phase from grain boundaries of the absorber film.

2. The method of claim 1, wherein the conditions comprise a temperature, a duration, and a pressure.

3. The method of claim 2, wherein the temperature is from about 10° C. to about 450° C.

4. The method of claim 2, wherein the duration is from about 1 minute to about 200 minutes.

5. The method of claim 2, wherein the pressure is from about $1\times10^{-5}$ Torr to about $5\times10^{-10}$ Torr.

6. The method of claim 1, wherein the annealing is performed at a temperature of from about 430° C. to about 550° C.

7. The method of claim 1, wherein the annealing is performed for a duration of from about 20 seconds to about 10 minutes.

8. The method of claim 1, wherein the secondary phase is selected from the group consisting of: $Ag_2Se$, $Ag_6SnSe_8$, and combinations thereof.

9. The method of claim 1, wherein the excess Ag is removed using an etchant selected from the group consisting of: potassium cyanide, sodium cyanide, and combinations thereof.

10. The method of claim 1, wherein the absorber film has an average grain size of from about 0.5 micrometers to about 4 micrometers.

11. The method of claim 1, further comprising:
    measuring composition of the absorber film using Particle Induced X-ray Emission (PIXE) techniques.

12. A method of forming a solar cell, comprising:
    contacting a conducting substrate with an Ag source, a Zn source, a Sn source, and at least one of an S source and an Se source under conditions sufficient to form the absorber film on the conducting substrate having a target composition of: $Ag_X Zn_Y Sn(S,Se)_Z$, wherein $1.7<x<2.2$, $0.9<y<1.3$, and $3.5<z<4.5$, and including an amount of the Ag source that is from about 10% to about 30% greater than is needed to achieve the target composition;
    annealing the absorber film;
    removing excess Ag, if any, from the absorber film, wherein the excess Ag forms a secondary phase, and wherein the removing is performed after the annealing to remove the secondary phase from grain boundaries of the absorber film;
    forming a buffer layer on the absorber layer; and
    forming a transparent front contact on the buffer layer.

13. The method of claim 12, wherein the conditions comprise a temperature of from about 10° C. to about 450° C., a duration of from about 1 minute to about 200, and a pressure of from about $1\times10^{-5}$ Torr to about $5\times10^{-10}$ Torr.

14. The method of claim 12, wherein the annealing is performed at a temperature of from about 430° C. to about 550° C., for a duration of from about 20 seconds to about 10 minutes.

15. The method of claim 12, wherein the secondary phase is selected from the group consisting of: $Ag_2Se$, $Ag_6SnSe_8$, and combinations thereof.

16. The method of claim 12, wherein the excess Ag is removed using an etchant selected from the group consisting of: potassium cyanide, sodium cyanide, and combinations thereof.

17. The method of claim 12, wherein the absorber film has an average grain size of from about 0.5 micrometers to about 4 micrometers.

\* \* \* \* \*